(12) United States Patent
Ritzmann et al.

(10) Patent No.: US 9,735,770 B2
(45) Date of Patent: Aug. 15, 2017

(54) METHOD FOR CONTROLLING SWITCHING EDGES FOR SWITCHED OUTPUT STAGES, CONTROL DEVICE, AND OUTPUT STAGE

(71) Applicant: Robert Bosch GmbH, Stuttgart (DE)

(72) Inventors: Steffen Ritzmann, Reutlingen (DE); Thoralf Rosahl, Eningen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/111,059

(22) PCT Filed: Nov. 21, 2014

(86) PCT No.: PCT/EP2014/075284
§ 371 (c)(1),
(2) Date: Jul. 12, 2016

(87) PCT Pub. No.: WO2015/106865
PCT Pub. Date: Jul. 23, 2015

(65) Prior Publication Data
US 2016/0336935 A1  Nov. 17, 2016

(30) Foreign Application Priority Data
Jan. 17, 2014 (DE) .......... 10 2014 200 752

(51) Int. Cl.
*H03K 5/12* (2006.01)
*H03K 17/16* (2006.01)
*H03K 19/003* (2006.01)

(52) U.S. Cl.
CPC ..... *H03K 17/165* (2013.01); *H03K 19/00361* (2013.01)

(58) Field of Classification Search
CPC .. B01D 15/327; B01D 15/362; B01D 15/363; B01D 15/3847
See application file for complete search history.

(56) References Cited

U.S. PATENT DOCUMENTS

| 6,784,708 B1 | 8/2004 | Krenzke |
| 2004/0140833 A1 | 7/2004 | Kim |
| 2007/0001725 A1* | 1/2007 | Atha ............... H03K 17/165 327/172 |
| 2010/0008113 A1 | 1/2010 | Kuno et al. |

OTHER PUBLICATIONS

International Search Report dated Feb. 5, 2015, of the corresponding International Application PCT/EP2014/075284, filed on Nov. 21, 2014.

* cited by examiner

*Primary Examiner* — Sibin Chen
(74) *Attorney, Agent, or Firm* — Gerard A. Messina; Norton Rose Fulbright US LLP

(57) ABSTRACT

A method is described for controlling switching edges for switched output stages, in which a voltage at a switching node of the output stage is detected; a reference time is started when the voltage reaches a predefined reference value; the steepness of the switching edge is reduced if the voltage has reached a second predefined reference value at an end of the reference time; and the steepness of the switching edge is increased if the voltage has not reached the second predefined reference value at the end of the reference time. Furthermore, a control device for adjusting switching edges for switched output stages is provided.

22 Claims, 3 Drawing Sheets

METHOD FOR CONTROLLING SWITCHING EDGES FOR SWITCHED OUTPUT STAGES, CONTROL DEVICE, AND OUTPUT STAGE

FIELD

The present invention relates to a method for controlling switching edges for switched output stages, a control device for adjusting switching edges for switched output stages, and an output stage having a control device.

BACKGROUND INFORMATION

Output stages or power switches are often operated in a clocked manner to turn on and off the loads connected thereto or to transfer energy thereto. During the clocking, switching edges arise, i.e., transitions from a turned-off state of the switch into a turned-on state. A compromise is to be found in the design of the switching edges between the power loss arising during the switching or during the edges, respectively, in the switch and the interfering emission due to the repeated switching procedures. Thus, edges having a greater slope du/dt (time derivative of the voltage) and therefore a shorter duration have lower losses, while edges having a lesser slope du/dt and therefore a longer duration mean fewer high-frequency (HF) emissions.

For many applications, it is therefore advantageous to keep the variance of the switching edges low, for example, as a result of technological tolerances, temperature, or supply voltage.

SUMMARY

An example method according to the present invention for controlling switching edges for switched output stages fundamentally includes the following steps:
  detecting a voltage at a switching node of the output stage;
  starting a reference time when the voltage reaches a first predefined reference value;
  reducing the steepness of the switching edge if the voltage has reached a second predefined reference value at an end of the reference time; and
  increasing the steepness of the switching edge if the voltage has not reached the second predefined reference value at the end of the reference time.

The example method according to the present invention very advantageously enables the variance or deviation of the switching edges to be kept very low in a robust fashion. This enables more consistent conditions with respect to the power loss, on the one hand, and the high-frequency emission, on the other hand. In addition, the method avoids a change of the switching edge in the event of temperature changes or over the service life, since the switching edges are defined via the reference time.

It is advantageously provided that a bistable trigger element, at the end of the reference time, accepts a comparative value of the voltage for the second predefined reference value and transfers it as a count signal to a counter, a downstream digital/analog converter reducing or increasing an activation current for the output stage as a function of the counter output. This digital control of the edges is simple to implement and enables a broad field of use.

The reference time may be programmable, for example, via a digital interface, which enables a broad adaptation of the method.

It is also possible that the reference time is variable as a function of parameters of the output stage or the switch controller. For example, if the switch controller has a variable frequency between 300 kHz and 2 MHz, the edges change accordingly, whereupon the reference time is adjusted as a function of this input variable, namely the frequency. It is thus ensured that the edges are optimally controlled for every operating state.

Rising and falling switching edges may be controlled independently of one another. This enables manifold possible uses.

According to the present invention, a control device for adjusting switching edges for switched output stages is provided, having a first comparator for comparing a voltage at a switching node of the output stage to a first predefined reference value, a timer, which is activated by the first comparator, for outputting a reference time if the voltage has reached the first predefined reference value, a second comparator for comparing the voltage to a second predefined reference value, a bistable trigger element, the data input of which is connected to the second comparator and the clock input of which is connected to the timer in such a way that a count signal for reducing or increasing an activation current for the output stage is provided at an output of the trigger element. The same advantages and modifications as described above apply.

The present invention includes a simple and robust device or circuit for the (digital) control of the edges of output stages and in particular switched output stage transistors. It is based on the comparison of a time which the switching edge requires to overcome a defined voltage difference, to a reference time and a change based thereon of the driver capability to activate the output stage. This enables very rapid control for high du/dt, i.e., switching edges of short duration and/or having great steepness. In addition, large voltage ranges may be controlled.

In one particular specific embodiment, it is provided that the count signal is supplied to a counter, and a digital/analog converter, which is connected to the counter, is configured to reduce or increase the activation current for the output stage as a function of a counter output of the counter. This is a simple and robust implementation.

It is also possible that the timer has a current source and a capacitor, the current source and/or the capacitor being trimmable. In this way, for example, process tolerances, which may correspond to times of, for example, 15 to 30 ns, may be compensated for, so that the timer may be trimmed to a reference variable.

Furthermore, an output stage having an above-described control device is provided according to the present invention, having a switch which is activatable by the activation current. The switch may preferably be an output stage transistor. The same advantages and modifications as described above apply.

It is advantageously provided that two above-described control devices are provided, one for rising edges and one for falling edges. This enables still greater leeway in the adaptation or setting of the switching edges.

Advantageous refinements of the present invention are described herein.

BRIEF DESCRIPTION OF THE DRAWINGS

Exemplary embodiments of the present invention are explained in greater detail below on the basis of the figures.

DETAILED DESCRIPTION OF EXAMPLE EMBODIMENTS

Figure 1:
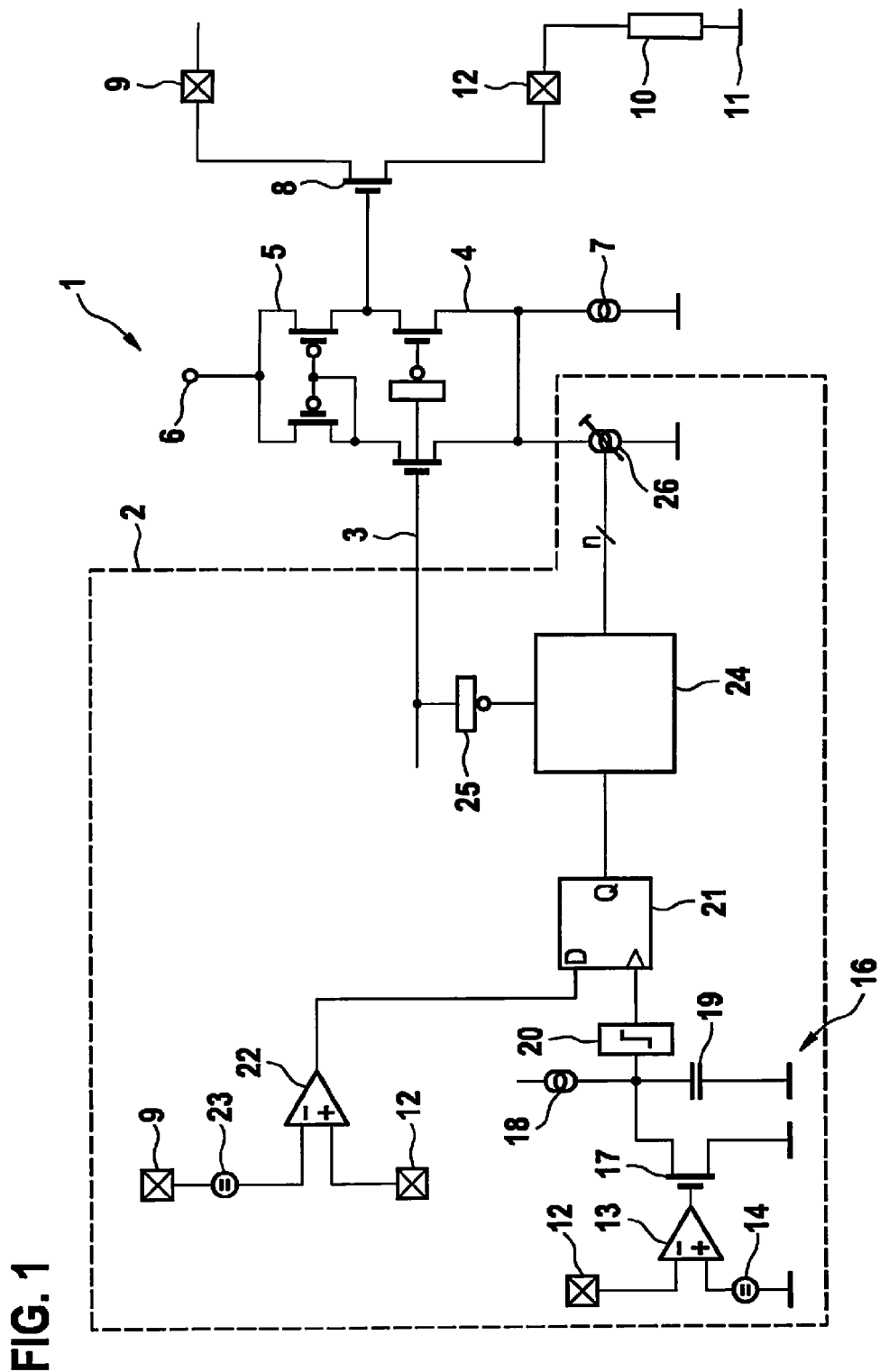
FIG. 1 shows a circuit diagram of the circuit according to the present invention for adjusting the edges.

FIG. 1 shows a switched output stage 1 having a control device 2 for adjusting the switching edges of switched output stage 1. Switched output stage 1 includes a switching input 3, to which an on/off signal is applied. This signal is supplied to a lower level 4, which is connected via an upper level 5 to a terminal 6 for a reference voltage. The second side of lower level 4 is connected to a current source 7, which supplies the base current for the switching function. The output of the level or of this driver circuit is connected to a switching transistor or output stage transistor 8. Transistor 8 is situated between a network node 9 for input voltage $V_{in}$ and a load 10. It is thus a so-called high-side switch. Output stage 1 or control device 2 may also be designed as a low-side switch by corresponding arrangements of transistor 8 between load 10 and a ground node 11. A switching node 12 is situated between transistor 8 and load 10.

Control device 2 or the control circuit will be described hereafter. Control device 2 may be defined as an independent unit or as a component of the output stage or switching controller 1. The two inputs of a comparator 13 are connected to switching node 12 and to a voltage source 14, which provides a lower reference voltage $V_{low}$. If, as shown in the timing diagram illustrated in FIG. 2, a rising edge 15 at switching node 12 exceeds lower reference voltage 14, the output signal of comparator 13 switches from logical 1 to logical 0.

Figure 2:
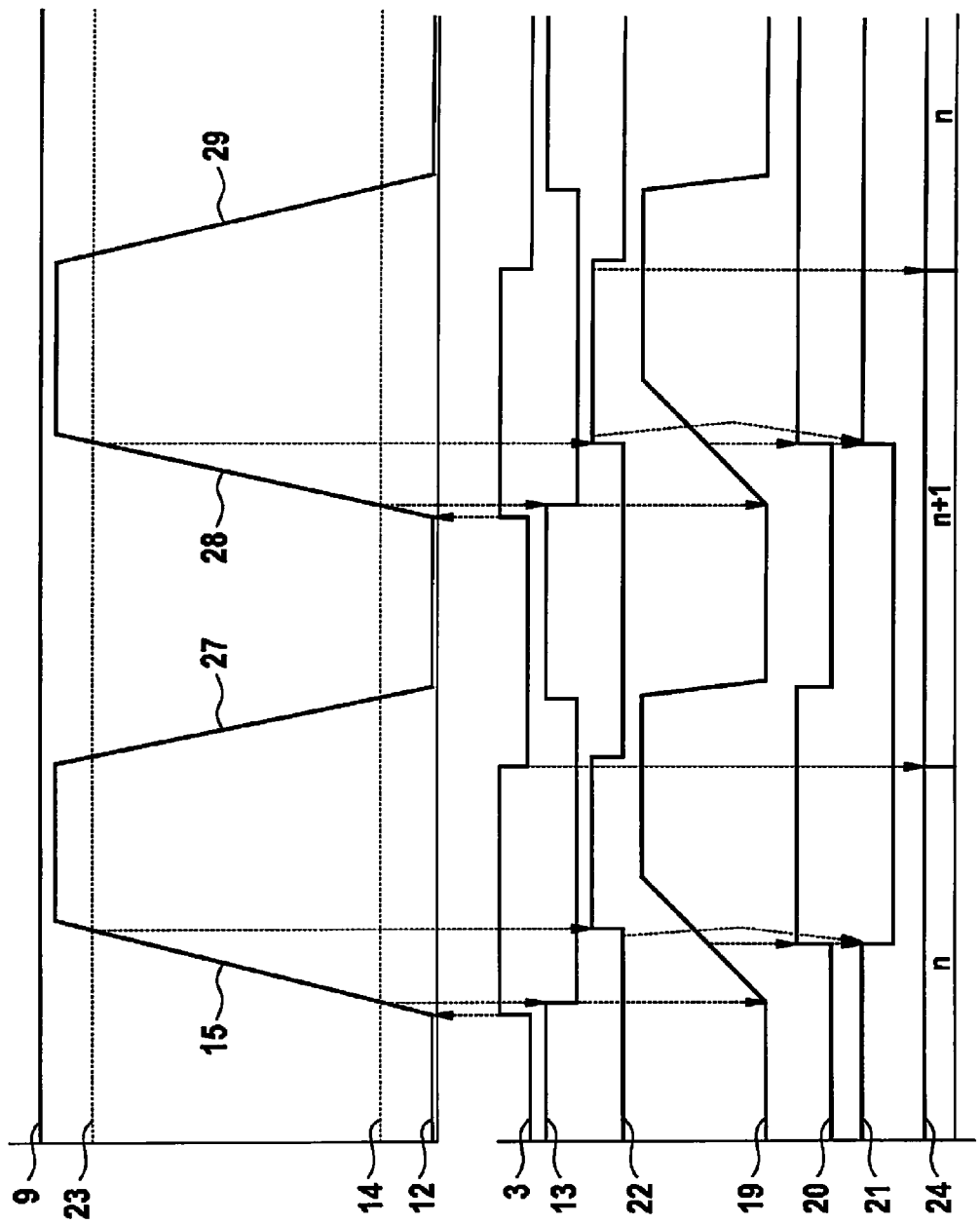
FIG. 2 shows a timing diagram having signal curves of the circuit from FIG. 1.

With the reduction of the output signal of comparator 13, a timer 16, which is designed as analog here, starts the reference time. Timer 16 includes a switching transistor 17, a current source 18, and a capacitor 19. The duration of the reference time is set via current source 18 and/or capacitor 19. The voltage across capacitor 19 is shown in FIG. 2. This voltage is applied at an input of a Schmitt trigger 20, the output of which switches from 0 to 1 at a specific threshold voltage. Schmitt trigger 20 may also be a component of timer 16. The length or duration of the reference time may also be set via Schmitt trigger 20, more precisely the threshold voltage thereof. Timer 16 may alternatively also be implemented as digital. The output of Schmitt trigger 20 is connected to a cycle input of a flip-flop or a bistable trigger stage 21.

A second comparator 22 is connected to switching node 12 and, via a voltage source 23, which provides an upper reference voltage $V_{high}$, to input node 9. The output signal of comparator 22 is switched from logical 0 to logical 1, as shown in FIG. 2, if rising edge 15 at switching node 12 exceeds upper voltage limit 23. This output signal of comparator 22 is applied to a data input of bistable trigger element 21.

After the reference time has elapsed, a positive clock edge is generated at the clock input of flip-flop 21, shown as signal curve 20 in FIG. 2, and the value of comparator 22, shown as signal curve 22 in FIG. 2, is accepted. If the switching edge at switching node 12 has exceeded upper limit voltage 23, comparator 22 supplies a high signal, otherwise a low signal. In the case of rising edge 15 in FIG. 2, the output signal of comparator 22 is still low or logical 0, since this increase is excessively slow. In other words, the voltage at switching node 12 has not yet reached upper predefined reference value 23 at the end of the reference time. This has the result that the output of flip-flop 21 switches from logical 1 to logical 0, as shown in FIG. 2 as signal curve 21.

Flip-flop 21 controls a downstream up/down counter 24. If flip-flop 21 supplies a high signal, i.e., the voltage at switching node 12 has exceeded the threshold $V_{high}$ before the reference time has elapsed, counter 24 thus counts down. Since input signal 3 supplies a count pulse to counter 24 via an inverter 25, only one counter event takes place per switching operation of output stage 1 in counter 24. Here, this means that during rising edge 15, flip-flop 21 supplies a low signal, so that counter 24 counts up during the next switching operation of input signal 3, shown in FIG. 2 as signal curve 24 from n to n+1.

This signal of counter 24 is provided to a downstream digital/analog converter 26 or a controlled current source. Digital/analog converter 26 accordingly increases the gate charging or discharging current for switching transistor 8 for the next edge by 1 bit, so that the next edge becomes faster.

For this purpose, controlled voltage source 26 changes the total current for switching transistor 8, preferably by approximately 20% to 30%. The main or base current is provided by current source 7, so that a superposition of the two currents forms the gate current for switching transistor 8.

Accordingly, next falling edge 27 and also next rising edge 28 are steeper with a bit value of n+1. During rising edge 28, control device 2 operates accordingly as during first rising edge 15, so that repetitions will be omitted here. In contrast to edge 15, however, rising edge 28 is excessively fast or, in other words, the duration thereof is excessively short, so that the voltage at switching node 12 has already exceeded upper limiting value $V_{high}$ before the end of the reference time, which has the result that the outputs of both comparator 22 and flip-flop 21 are logical 1 or are switched up. This has the result that counter 24 counts down, whereby the next edge, falling edge 29 here, is again generated with a bit value n.

Therefore, counter 24 alternately counts one bit upward and one bit downward in the transient state. The edges still vary by the least significant bit (LSB). Counter 24 is preferably designed at least as a 3-bit counter, so that eight steps are available for controlling the edge steepness. In the example shown in FIG. 1, rising edge 15 or 28 is measured and controlled, and the result is adopted by the next falling and rising edge.

Figure 3:
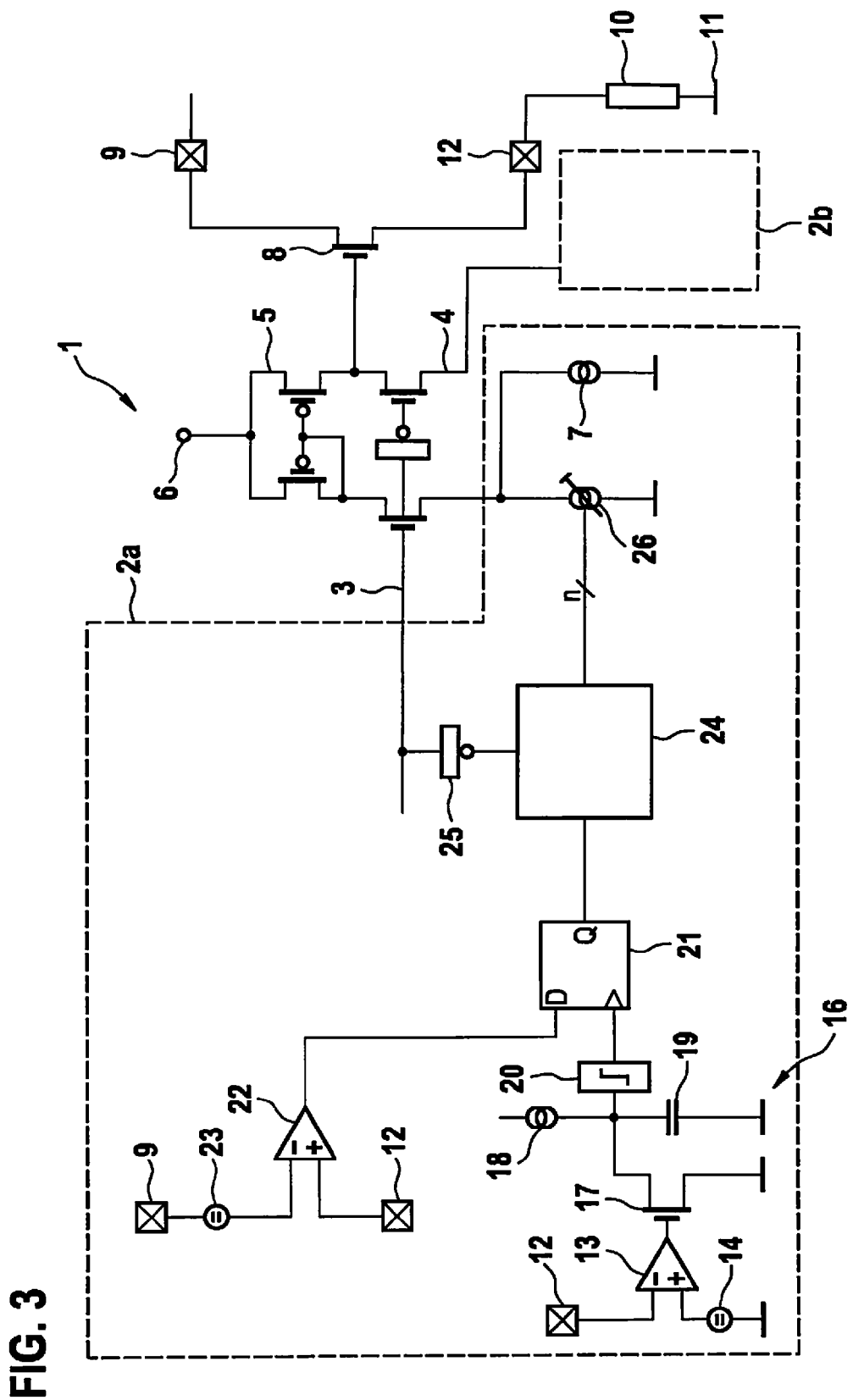
FIG. 3 shows a circuit diagram of the circuit according to the present invention for the independent adjustment of rising and falling edges.

FIG. 3 shows an output stage 1 having a control device, in which it is possible to control rising and falling edges independently of one another. For this purpose, two control devices 2a and 2b are provided. Control devices 2a and 2b essentially correspond to control device 2 from FIG. 1. In contrast to control device 2 from FIG. 1, current source 7 is integrated into control devices 2a and 2b from FIG. 3. While control device 2a controls the rising edges similarly to control device 2, control device 2b controls the falling edges similarly to control device 2.

What is claimed is:
1. A method for controlling switching edges for switched output stages, comprising:
   detecting a voltage at a switching node of the output stage;
   starting a reference time period when the voltage reaches a first predefined reference value;
   determining whether the voltage has reached a second predefined reference value by the time an end of the reference time period has been reached; and modifying a steepness of the switching edge, a type of the modification being a reducing of the steepness if the voltage has reached the second predefined reference value at the end of the reference time period and being an increasing of the steepness of the switching edge if the voltage has not reached the second predefined reference value at the end of the reference time period; wherein at least one of:

the starting of the reference time period and the determining of whether the voltage has reached the second predefined reference value by the time the reference time period has ended is performed a plurality of times, and the modifying of the steepness of the switching edge is performed in response to each and every determination of whether the voltage has reached the second predefined reference value by the time the end of the reference time period has been reached;

a base current source supplies a base current to a switch that switches between power on and power off modes, a supplemental current source supplies a modifiable current that is superimposed onto the base current that is supplied to the switch, and the modifying is performed by controlling the supplemental current source to modify a level of the modifiable current of the supplemental current source;

an on/off signal is supplied to trigger a transition between power on and power off modes, and the on/off signal is used for triggering a sampling device that performs the determining of whether the voltage has reached the second predefined reference value by the time the end of the reference time period has been reached; and the switching edges are edges between on and off power levels corresponding to a power on mode in which a load is powered by a voltage source and a power off mode in which the voltage source does not power the load, and the second predefined reference value is a voltage output by the voltage source.

2. The method as recited in claim 1, wherein a bistable trigger element adopts a comparative value of the voltage for the second predefined reference value at the end of the reference time and transmits it as a count signal to a counter, and a downstream digital/analog converter reduces or increases an activation current for the output stage as a function of the counter output.

3. The method as recited in claim 1, wherein the reference time is programmable.

4. The method as recited in claim 1, wherein the reference time is variable as a function of parameters of the output stage.

5. The method as recited in claim 1, wherein the starting of the reference time period and the determining of whether the voltage has reached the second predefined reference value by the time the reference time period has ended is performed the plurality of times, and the modifying of the steepness of the switching edge is performed in response to each and every determination of whether the voltage has reached the second predefined reference value by the time the end of the reference time period has been reached.

6. The method as recited in claim 1, wherein the base current source supplies the base current to the switch that switches between the power on and power off modes, the supplemental current source supplies the modifiable current that is superimposed onto the base current that is supplied to the switch, and the modifying is performed by controlling the supplemental current source to modify the level of the supplemental current source.

7. The method as recited in claim 1, wherein the on/off signal is supplied to trigger the transition between the power on and power off modes, and the on/off signal is used for triggering the sampling device that performs the determining of whether the voltage has reached the second predefined reference value by the time the end of the reference time period has been reached.

8. The method as recited in claim 1, wherein the switching edges are the edges between the on and off power levels corresponding to the power on mode in which the load is powered by the voltage source and the power off mode in which the voltage source does not power the load, and the second predefined reference value is the voltage output by the voltage source.

9. A method for independently controlling rising and falling switching edges for switched output stages, comprising:

detecting a voltage at a switching node of the output stage; and performing the following independently for each the rising and falling switching edges:
starting a respective reference time period when the voltage reaches a respective first predefined reference value;
determining whether the voltage has reached a respective second predefined reference value by the time an end of the respective reference time period has been reached; and
modifying a steepness of the respective switching edge, a type of the modification being a reducing of the steepness if the voltage has reached the respective second predefined reference value at the end of the respective reference time period and being an increasing of the steepness of the respective switching edge if the voltage has not reached the respective second predefined reference value at the end of the respective reference time period.

10. A control device for adjusting switching edges for switched output stages, comprising:

a first comparator for comparing a voltage at a switching node of the output stage to a first predefined reference value;

a timer, which is activated by a result of the first comparator being that the voltage has reached the first predefined reference value, the timer being configured to output a reference time when a reference time period has lapsed after the activation of the timer;

a second comparator for comparing the voltage to a second predefined reference value;

a bistable trigger element, a data input of the trigger element being connected to the second comparator and a clock input of the trigger element being connected to the timer in such a way that the bistable trigger element is configured to produce an output that indicates whether the voltage has reached the second predefined reference value by the time an end of the reference time period has been reached, the output of the bistable trigger element determining a value of a count signal for modifying an activation current for the output stage, a type of the modification being a reducing of the activation current if the voltage has reached the second predefined reference value at the end of the reference time period and being an increasing of the activation current if the voltage has not reached the second predefined reference value at the end of the reference time period;

wherein at least one of:

the control device is configured for the activation of the timer and a sampling of the output of the bistable trigger element for determining whether the voltage has reached the second predefined reference value by the time the reference time period has ended to be performed a plurality of times, and the modifying of the activation current is performed in response to each and every determination, based on the sampling, of whether the voltage has reached the second predefined reference value by the time the end of the reference time period has been reached;

a base current source supplies a base current to a switch that switches between power on and power off modes, a supplemental current source supplies a modifiable current that is superimposed onto the base current that is supplied to the switch, and the modifying is performed by controlling the supplemental current source to modify a level of the modifiable current of the supplemental current source;

an on/off signal is supplied to trigger a transition between power on and power off modes, and the on/off signal is used for triggering a sampling device that samples the bistable trigger element to determine whether the voltage has reached the second predefined reference value by the time the end of the reference time period has been reached; and a level of the activation current controls a steepness of switching edges between on and off power levels corresponding to a power on mode in which a load is powered by a voltage source and a power off mode in which the voltage source does not power the load, and the second predefined reference value is a voltage output by the voltage source.

11. The control device as recited in claim 10, wherein the count signal is supplied to a counter, and a digital/analog converter, which is connected to the counter, is configured to reduce or increase the activation current for the output stage as a function of a counter output of the counter.

12. The control device as recited in claim 10, wherein the timer has a current source and a capacitor, and at least one of the current source and the capacitor is trimmable.

13. An output stage having a control device as recited in claim 10, further comprising:

a switch which is activatable by the activation current.

14. The output stage as recited in claim 13, wherein two control devices are provided, one of the control devices being for rising edges and the other one of the control devices being for falling edges.

15. The control device as recited in claim 10, wherein the control device is configured for the activation of the timer and the sampling of the output of the bistable trigger element for determining whether the voltage has reached the second predefined reference value by the time the reference time period has ended to be performed the plurality of times, and the modifying of the activation current is performed in response to each and every determination, based on the sampling, of whether the voltage has reached the second predefined reference value by the time the end of the reference time period has been reached.

16. The control device as recited in claim 10, wherein the base current source supplies the base current to the switch that switches between the power on and power off modes, the supplemental current source supplies the modifiable current that is superimposed onto the base current that is supplied to the switch, and the modifying is performed by controlling the supplemental current source to modify the level of the modifiable current of the supplemental current source.

17. The control device as recited in claim 10, wherein the on/off signal is supplied to trigger the transition between the power on and power off modes, and the on/off signal is used for triggering the sampling device that samples the bistable trigger element to determine whether the voltage has reached the second predefined reference value by the time the end of the reference time period has been reached.

18. The control device as recited in claim 17, wherein a load is powered in the power on mode and is not powered in the power off mode.

19. The control device as recited in claim 18, wherein the on/off signal is supplied to an inverter to produce a signal that is supplied to the sampling device.

20. The control device as recited in claim 10, wherein the level of the activation current controls the steepness of the switching edges between the on and off power levels corresponding to the power on mode in which the load is powered by the voltage source and the power off mode in which the voltage source does not power the load, and the second predefined reference value is the voltage output by the voltage source.

21. The control device as recited in claim 10, wherein the control device is configured to perform the modification of the activation current based on output of a counter that is variable between only eight states for varying the activation current between eight levels.

22. The control device as recited in claim 21, wherein the counter produces a three bit output.

* * * * *